United States Patent [19]

Mahabadi et al.

[11] Patent Number: 4,507,570
[45] Date of Patent: Mar. 26, 1985

[54] RESETTABLE ONE SHOT CIRCUIT HAVING NOISE REJECTION

[75] Inventors: John K. Mahabadi; Victor D. Ehrlich, both of Mesa, Ariz.

[73] Assignee: Motorola, Inc., Schaumburg, Ill.

[21] Appl. No.: 471,106

[22] Filed: Mar. 1, 1983

[51] Int. Cl.³ .................... H03K 3/033; H03K 3/355
[52] U.S. Cl. .................................. 307/273; 307/265; 307/279; 328/207
[58] Field of Search .............. 307/273, 279, 265, 269, 307/593, 608; 328/207

[56] References Cited

U.S. PATENT DOCUMENTS

| | | | |
|---|---|---|---|
| 3,761,743 | 9/1973 | Barber | 307/273 |
| 3,768,026 | 10/1973 | Pezzutti | 328/207 |
| 4,254,346 | 3/1981 | Yamada et al. | 307/273 |

Primary Examiner—John Zazworsky
Attorney, Agent, or Firm—Joe E. Barbee

[57] ABSTRACT

A one shot circuit having feedback from the output to an input gate is provided to inhibit the input gate when an output is being provided. This feedback inhibits the input gate thereby preventing noise on the input from falsely triggering the one shot. A capacitor in conjunction with a Schmitt trigger is used to determine output pulse width. The output pulse width can be increased by adding additional capacitance to the first capacitor which is fully integrated on an integrated circuit chip. A reset input is also provided so that the circuit can be reset upon command.

6 Claims, 2 Drawing Figures

RESETTABLE ONE SHOT CIRCUIT HAVING NOISE REJECTION

BACKGROUND OF THE INVENTION

This invention relates, in general, to one shot circuits, and more particularly, to a resettable one shot circuit having noise rejection.

One shot circuits, also called monostable multi-vibrators, are well known and have been used in electronic circuits for a long time. Many digital systems use some kind of a one shot circuit as a delay network for resetting the system. This presettable delay allows the system to stablize during the initial power up time period, therefore allowing the oscillators, clocks, and other signals to be present before normal operation of the system. The one shot circuit can also be used as a small delay for preventing race conditions in digital systems. In addition, there are other applications such as frequency doublers and low pass filters. Some commercially available one shot circuits are MC14528 and MC14538 sold by Motorola, Inc. A highly accurate one shot multi-vibrator, having a large amount of digital circuitry, is disclosed in U.S. Pat. No. 3,768,026 which issued Oct. 23, 1973. The one shot disclosed in this patent uses the output to control a first logic gate thereby gating clock signals into the one shot multivibrator. Such a circuit while highly accurate requires considerable amounts of digital circuitry. Many applications do not require such a highly accurate one shot but do require a one shot which would consume a smaller amount of silicon area on an integrated circuit.

Accordingly, it is an object of the present invention to provide an improved one shot circuit which is retriggerable and resettable.

Another object of the present invention is to provide a one shot circuit which uses a feedback signal from the output to reject input noise and which operates in an analog fashion.

SUMMARY OF THE INVENTION

The above and other objects and advantages of the present invention are provided by a CMOS resettable one shot circuit. An input gate is used to receive an input signal. The input gate provides an output to a timing circuit which in turn provides an output to a Schmitt trigger. Once the output of the timing circuit exceeds a predetermined value the Schmitt trigger provides an output to an output logic gate. The output logic gate provides a one shot signal which is also used as feedback to the input gate which locks out any noise during the time that the output gate is providing an output signal. In addition, the output of the output gate is provided to an additional timing circuit which is used to trigger a second Schmitt trigger. The output of the second Schmitt trigger is connected to an output logic gate which provides an additional output for the one shot circuit.

DETAILED DESCRIPTION OF THE DRAWINGS

Figure 1:
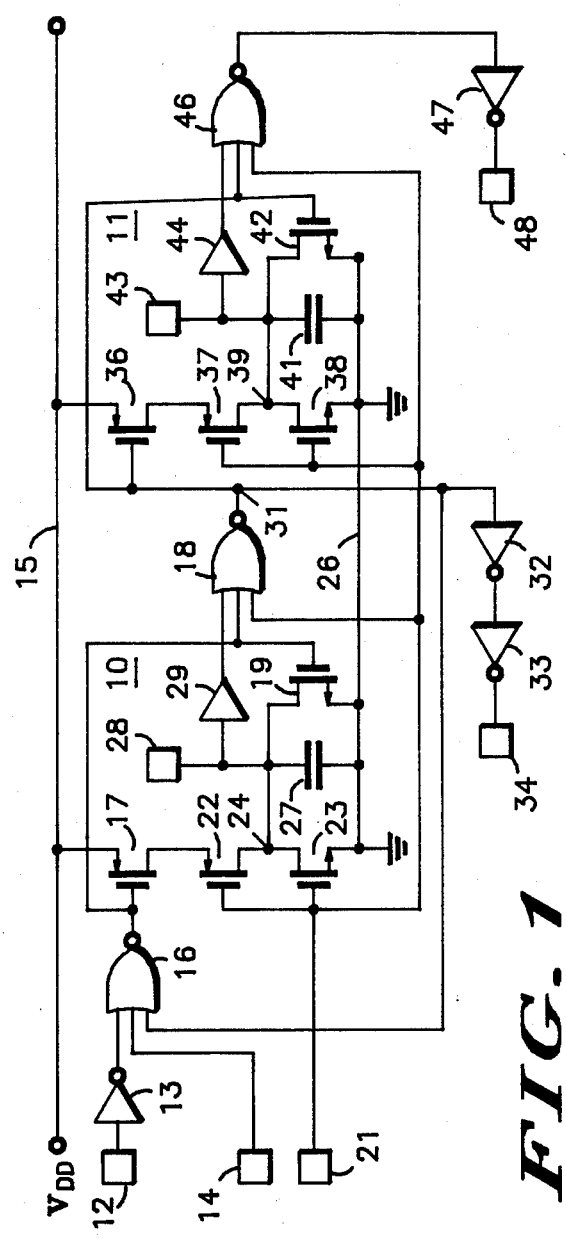
FIG. 1 illustrates in schematic and logic diagram form an embodiment of the present invention.

An embodiment of the present invention is illustrated in FIG. 1. The one shot circuit illustrated in FIG. 1 has a first portion 10 and a second portion 11. The first portion 10 provides an output one shot signal while second portion 11 provides an additional one shot signal which is delayed from the output of circuit 10. A first input terminal 12 provides an input to inverter 13. The output of inverter 13 is connected to an input of an input logic gate 16. A second input of logic gate 16 is connected to input terminal 14. The output of logic gate 16 is connected to a gate electrode of a P-channel transistor 17, to the gate electrode of an N-channel transistor 19, and to an input of an output logic gate 18. The source electrode of transistor 17 is connected to a power supply line 15 which is illustrated as receiving voltage $V_{DD}$. The drain electrode of transistor 17 is connected to the source electrode of a P-channel transistor 22. The drain electrode of transistor 22 is connected to node 24. The gate electrode of transistor 22 is connected to the gate electrode of an N-channel transistor 23 which in turn is connected to reset input terminal 21. A capacitor 27 is connected from node 24 to power supply line 26 which is illustrated as being a reference or ground line. Transistor 23 has its drain electrode connected to node 24 and its source electrode connected to power supply line 26. Transistor 19 has its drain electrode connected to node 24 and its source electrode connected to power supply line 26. As mentioned previously, the gate electrode of transistor 19 is connected to an input of output logic gate 18 and to the output of input logic gate 16. Also connected to node 24 is a contact pad or connection pin 28 which can be used to add additional external capacitance to circuit 10 to provide a longer output pulse at output 31. Node 24 is also connected to the input of a Schmitt trigger 29 which provides an output to an input of logic gate 18. Schmitt trigger 29 is used to provide an output whenever the voltage across capacitor 27 builds up to a predetermined value. Output logic gate 18 also has a third input which is connected to reset input terminal 21. Logic gate 18 provides an output to node 31. Output node 31 is connected to a third input of input logic gate 16 and to an input of inverter 32. The output of inverter 32 is coupled to output pin or terminal 34 by inverter 33. Inverter 33 provides either a CMOS-to-CMOS interface or a CMOS-to-TTL interface while inverter 32 is used to compensate for the inversion provided by inverter 33.

The output of logic gate 18 is also connected to the gate electrode of a P-channel transistor 36, the gate electrode of an N-channel transistor 42, and to an input of output logic gate 46. The source electrode of transistor 36 is connected to power supply line 15 and the drain electrode of transistor 36 is connected to the source electrode of a P-channel transistor 37. The drain electrode of transistor 37 is connected to node 39. The gate electrode of transistor 37 is connected to the gate electrode of an N-channel transistor 38, to the input of output logic gate 46 and to reset input terminal 21. Transistor 38 has its drain connected to node 39 and its source connected to power supply line 26. Capacitor 41 is connected between node 39 and power supply line 26. N-channel transistor 42 has its drain connected to node 39 and its source connected to power supply line 26. Contact pad or terminal 43 is connected to node 39 and provides the capability of adding additional capacitance in parallel with capacitor 41 to increase the time of the output pulse provided by circuit 11. Also connected to node 39 is an input for Schmitt trigger 44 which provides an output to an input of output logic gate 46. Logic gate 46 also receives an input from reset terminal 21. Logic gate 46 provides an output to inverter 47 which serves as a CMOS-to-CMOS interface buffer or can serve as a CMOS-to-TTL interface buffer. The output of inverter 47 is connected to output pin or terminal 48.

The entire circuit of FIG. 1 can be integrated on a single semiconductor chip. If larger capacitors are desired these can be added external to the chip at terminals 28 and 43. Schmitt triggers 29 and 44 can be any conventional Schmitt trigger circuit such as back-to-back CMOS inverters.

Figure 2:
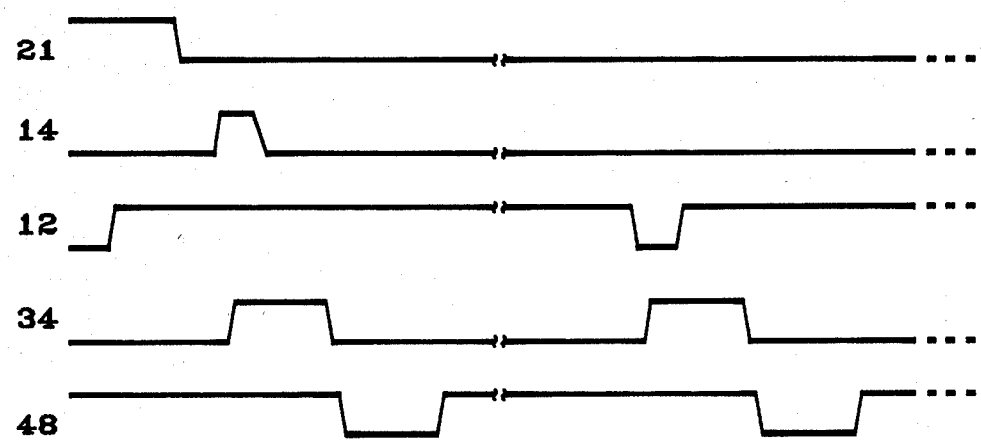
FIG. 2 shows some waveforms useful in understanding the operation of the circuit of FIG. 1.

The operation of the circuit of FIG. 1 can be better understood with reference to the waveforms of FIG. 2. The waveforms of FIG. 2 are identified by numerals which correspond to the numerals used in FIG. 1 to identify the input and output terminals. The top waveform in FIG. 2 refers to the reset signal appearing at reset terminal 21. The second and third waveforms refer to input terminals 14 and 12 respectively. The output waveforms are identified by 34 and 48 which represent output waveforms expected at terminals 34 and 48. In FIG. 2 it is assumed that, to begin with, reset input 21 is high, input 14 is low and input 12 is high. By reset signal 21 being high, transistors 23 and 38 will be enabled while transistors 22 and 37 will be inhibited. The conduction of transistors 23 and 38 will ensure that capacitors 27 and 41, respectively, are discharged. This will cause Schmitt triggers 29 and 44 to provide a logic "0" to inputs of logic NOR gates 18 and 46, respectively. The output of logic gate 16 will be a logic level "1" caused by the zeros on its inputs. A logic level "1" will inhibit transistor 17 and enable transistor 19. Also, the logic level "1" will appear on the input of NOR gate 18 causing the output of NOR gate 18 to be a zero. The logic level "0" on the output of logic gate 18 will appear as a zero at output terminal 34 and will also enable transistor 36 while inhibiting transistor 42. The logic level "1" provided by reset signal 21 to the input of logic gate 46 will cause its output to be a logic level "0". This logic level "0" is inverted by inverter 47 and provided as a logic level "1" at output terminal 48.

When reset goes to logic level "0" transistors 23 and 38 are inhibited while transistors 22 and 37 are enabled. The one shot circuit is now ready to respond to an input signal. As illustrated in FIG. 2, input 14 then goes high and input 12 remains high. This causes the output of NOR gate 16 to provide a zero output which enables transistor 17 and disables transistor 19. At the same time the input to NOR gate 18, provided by the output of NOR gate 16, is a logic "0", and since all three inputs to NOR gate 18 are now logic zeros its output will become a logic level "1". This logic level "1" is provided to output terminal 34. The logic level "1" inhibits transistor 36 thereby resulting in no change in the output of logic gate 46. Since the output of logic gate 16 enables transistor 17 and transistor 22 is enabled by the logic level "0" of the reset input at terminal 21 capacitor 27 will start to charge up. As the charge on capacitor 27 reaches the input threshold of Schmitt trigger 29, a logic level "1" will be caused to appear at the first input of NOR gate 18. This will cause the output of NOR gate 18 to return to a logic level "0". This results in an output pulse being provided at output terminal 34 which commences on the leading edge of input signal 14 delayed by logic gates 16, 18 and inverters 32, 33. The width of the output pulse appearing at terminal 34 is determined by capacitor 27 and the input threshold of Schmitt trigger 29. If a wider pulse is desired then an external capacitor can be added to terminal 28. The width of input signal 14 is not critical since the circuit of FIG. 1 responds to edge of the pulse. Accordingly, the trailing edge of input signal 14 is shown dotted in FIG. 2 indicating that it can be wider or narrower than output pulse 34.

When the output of logic gate 18 goes back to zero, transistor 36 is enabled and the third logic level "0" is applied to output gate 46. This causes output gate 46 to provide a logic level "1" to inverter 47 resulting in a logic level "0" at output terminal 48. Since transistors 36 and 37 are enabled, capacitor 41 will charge up. Schmitt trigger 44 will provide a logic level "1" to output gate 46 when the charge across capacitor 41 reaches the input threshold of Schmitt trigger 44. This causes the output of output gate 46 to return to a logic level "0" which is inverted by inverter 47 providing a logic level "1" at output 48. If the output pulse from circuit 11 is desired to be wider, an additional capacitor can be added to auxiliary terminal 43.

Outputs 34 and 48 can also be obtained by holding input 14 low and making input 12 go low as indicated. The width of the low input 12 is not critical as indicated by the dotted lines. Outputs 34 and 48 will be the same width whether caused by input 14 or input 12.

When the output of output logic gate 18 is a logic level "1" it will inhibit input logic gate 16 so that no matter what happens to input signals 12 and 14 the output of logic gate 16 will not change until output gate 18 provides a zero output. This feature of the one shot circuit illustrated in FIG. 1 prohibits noise on the input terminals 12 and 14 from falsely triggering the one shot when it is providing an output pulse.

By now it should be appreciated that there has been provided a retriggerable, resettable dual one shot circuit having noise rejection. The one shot circuit can be fully integrated including its timing capacitor. If the output pulse is desired to be lengthened, an external capacitor can be provided to auxiliary pins or terminals.

We claim:

1. A one shot circuit with noise rejection, comprising: a first logic gate for receiving first and second inputs and a feedback signal; a first transistor having a first and a second current carrying electrode and a control electrode, the first current carrying electrode being connected to a first power supply line, the control electrode being connected to an output of the first logic gate; a second transistor having a first current carrying electrode connected to the second current carrying electrode of the first transistor and having a control electrode connected to a reset input; a third transistor having a first current carrying electrode connected to the second current carrying electrode of the second transistor, having a control electrode connected to the reset input, and having a second current carrying electrode connected to a second power supply line; a capacitor connected across the first and second current carrying electrodes of the third transistor; a fourth transistor having a first current carrying electrode connected to the first current carrying electrode of the third transistor, having a second current carrying electrode connected to the second power supply line, and having a control electrode connected to the output of the first logic gate; a Schmitt trigger circuit; and a second logic gate having a first input coupled to the first current carrying electrode of the fourth transistor by the Schmitt trigger, having a second input connected to the output of the first logic gate, and having a third input connected to the reset input.

2. The one shot circuit of claim 1 further including a fifth transistor having a first current carrying electrode connected to the first power supply line and a control electrode connected to an output of the second logic gate; a sixth transistor having a first current carrying electrode connected to a second current carrying electrode of the fifth transistor; a seventh transistor having a first current carrying electrode connected to a second current carrying electrode of the sixth transistor and having a control electrode connected to a control electrode of the sixth transistor and to the reset input and having a second current carrying electrode connected to the second power supply line; a second capacitor having a first electrode connected to the first current carrying electrode of the seventh transistor and having a second electrode connected to the second power supply line; an eighth transistor having a first current carrying electrode connected to the first electrode of the second capacitor, a second current carrying electrode connected to the second power supply line, and a control electrode connected to the output of the second logic gate; a second Schmitt trigger circuit; and a third logic gate having a first input coupled by the Schmitt trigger circuit to the first electrode of the second capacitor, a second input connected to the output of the second logic gate, a third input connected to the reset input, and having an output.

3. The one shot circuit of claim 2 wherein the first, second, fifth and sixth transistors are P-channel field effect transistors, and the third, fourth, seventh, and eighth transistors are N-channel field effect transistors.

4. The one shot circuit of claim 3 wherein the first, second, and third logic gates are NOR gates.

5. A resettable one shot circuit having noise rejection, comprising: an input gate for receiving input signals; first means for providing a first time interval and being coupled to the input gate; a voltage level detector coupled to the first means for providing an output; an output gate coupled to the voltage level detector for providing an output, the output of the output gate being coupled to the input gate to inhibit the input gate whenever the output gate is providing an output; and a reset input coupled to the first means and to the output gate for resetting the one shot circuit.

6. The resettable one shot circuit of claim 5 further including second means for providing a second time interval and being coupled to the output of the output gate; a second voltage level detector having an input coupled to the second means and providing an output; and a second output gate coupled to the output of the second voltage level detector and providing a second output for the one shot circuit.

* * * * *